(12) United States Patent
Schmid et al.

(10) Patent No.: US 9,190,554 B2
(45) Date of Patent: Nov. 17, 2015

(54) METHOD AND DEVICE FOR INDUSTRIALLY PRODUCING PHOTOVOLTAIC CONCENTRATOR MODULES

(71) Applicant: Grenzebach Maschinenbau GmbH, Asbach-Baeumenheim (DE)

(72) Inventors: Markus Schmid, Burgheim (DE); Alexander Feineis, Donauwoerth (DE)

(73) Assignee: Grenzebach Maschinenbau GmbH, Asbach-Baeumenheim (DE)

( * ) Notice: Subject to any disclaimer, the term of this patent is extended or adjusted under 35 U.S.C. 154(b) by 0 days.

(21) Appl. No.: 14/353,732

(22) PCT Filed: Dec. 6, 2012

(86) PCT No.: PCT/DE2012/001160
§ 371 (c)(1),
(2) Date: Apr. 23, 2014

(87) PCT Pub. No.: WO2013/083111
PCT Pub. Date: Jun. 13, 2013

(65) Prior Publication Data
US 2014/0295611 A1 Oct. 2, 2014

(30) Foreign Application Priority Data
Dec. 8, 2011 (DE) ...................... 20 2011 108 836 U

(51) Int. Cl.
*H01L 27/148* (2006.01)
*H01L 31/18* (2006.01)
(Continued)

(52) U.S. Cl.
CPC ............ *H01L 31/18* (2013.01); *H01L 21/6715* (2013.01); *H01L 21/67706* (2013.01);
(Continued)

(58) Field of Classification Search
CPC . H01L 21/68; H01L 31/02024; H01L 31/042; H01L 31/048; H01L 31/0504; H01L 31/0524; H01L 31/054; H01L 31/0543; H01L 31/0547; H01L 31/18; H01L 31/188
USPC .................. 257/226, 231, 233, 293, E25.009, 257/E33.076, E31.115, E31.121; 29/709, 29/712; 359/742
See application file for complete search history.

(56) References Cited

U.S. PATENT DOCUMENTS 4,834,805 A 5/1989 Erbert
8,553,338 B1 * 10/2013 Geng ............................ 359/727
(Continued)

FOREIGN PATENT DOCUMENTS

JP S6334282 2/1988
JP H10190036 7/1998
(Continued)

OTHER PUBLICATIONS

English Translation of the Japanese Notice Of Reasons For Rejection Mailed May 26, 2015.

*Primary Examiner* — Kyoung Lee
*Assistant Examiner* — Joannie A Garcia
(74) *Attorney, Agent, or Firm* — Duane Morris LLP; J. Rodman Steele, Jr.; Gregory M. Lefkowitz

(57) ABSTRACT

The invention relates to a device for industrially producing photovoltaic concentrator modules which consist of a module frame, a lens pane comprising a plurality of Fresnel lenses, a sensor-carrier pane, and an electric line guide, said device comprising the following features: a) a carriage (30) for retaining a module frame (1) in a tension-free manner by means of clamping elements (31) on the two longitudinal sides and stop elements (37) on the two transverse sides, these clamping elements (31) being adjusted by displacing and rotating a shift rod (32), b) a device (47) for punctually applying acrylic and linearly applying silicone (48) onto the support surfaces of the module frame (1), c) one device for laying the sensor-carrier pane (3) and one for laying the lens pane (2), these panes being conveyed in a tension-free manner using special suction devices (39) and being set down with a centrally-positioned, predetermined contact pressure, d) a device for measuring the position of each pane and for positioning the sensor-carrier pane (3) or lens pane (2), e) a device for finely-adjusting said lens pane (2) relative to CPV sensors (4) of the sensor-carrier pane (3), a voltage being supplied to selected CPV sensors whereupon the light emitted therefrom via the Fresnel lenses (5) is sensed and the lens pane (2) is aligned such that the emission from particularly strategically important Fresnel lenses (5) is at a maximum, f) a device for curing the applied silicone between the module frame (1) and the pane in question, using a plurality of UV light-emitting elements (40), and g) devices for conveying the workpieces to be processed.

5 Claims, 16 Drawing Sheets

Figure 1:
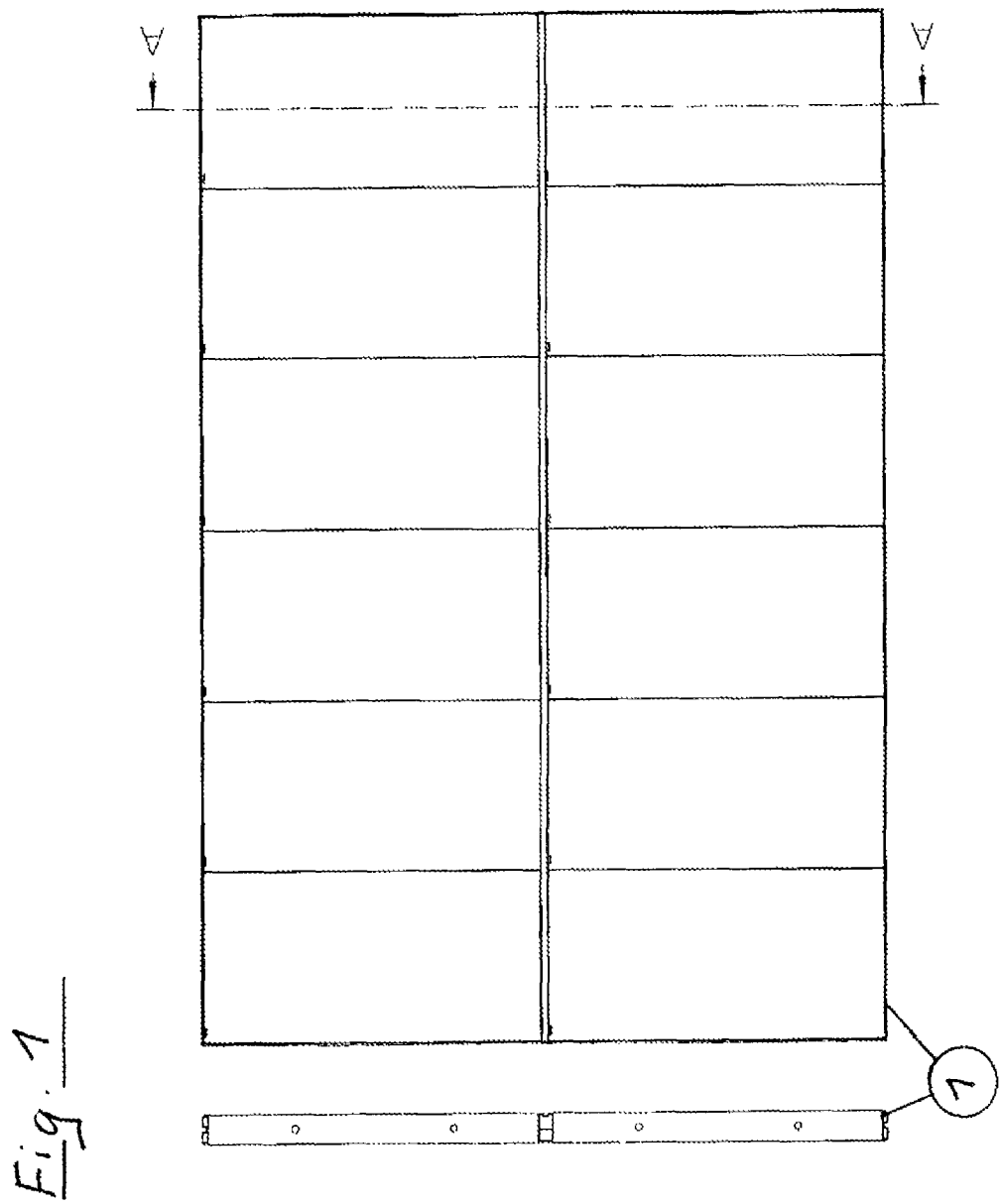

(51) Int. Cl.
*H01L 21/67* (2006.01)
*H01L 21/677* (2006.01)
*H01L 21/68* (2006.01)
*H01L 31/048* (2014.01)
*H01L 31/054* (2014.01)

(52) U.S. Cl.
CPC .............. *H01L21/68* (2013.01); *H01L 31/048* (2013.01); *H01L 31/0543* (2014.12); *H01L 31/1876* (2013.01); *Y02E 10/52* (2013.01); *Y10T 29/532* (2015.01)

(56) References Cited

U.S. PATENT DOCUMENTS

| | | |
|---|---|---|
| 2002/0140079 A1 | 10/2002 | Takeyama |
| 2002/0191287 A1 | 12/2002 | Miyazawa |
| 2004/0047118 A1 | 3/2004 | Bergmann |
| 2006/0051109 A1 | 3/2006 | Lim |
| 2007/0263289 A1 | 11/2007 | Monoe et al. |
| 2009/0126794 A1 | 5/2009 | Dimroth et al. |
| 2010/0011565 A1 | 1/2010 | Zawadzki et al. |
| 2010/0059043 A1 * | 3/2010 | Hong et al. .................... 126/573 |
| 2010/0143117 A1 | 6/2010 | Xiong |
| 2011/0162637 A1 * | 7/2011 | Hahn ............................ 126/600 |
| 2012/0136470 A1 | 5/2012 | Deans |

FOREIGN PATENT DOCUMENTS

| | | | |
|---|---|---|---|
| JP | 2001274441 | 10/2001 | |
| JP | 2001328197 | 11/2001 | |
| JP | 2005297398 | 10/2005 | |
| JP | 2006344698 | 12/2006 | |
| JP | 2007313607 | 12/2007 | |
| JP | 2009067042 | 4/2009 | |
| JP | 2009172639 | 8/2009 | |
| JP | 2010034134 | 2/2010 | |
| JP | 2011115914 | 6/2011 | |
| JP | 2011213435 | 10/2011 | |
| JP | 2011215380 | 10/2011 | |
| WO | WO 2010124078 A2 * | 10/2010 | ............ H01L 31/042 |

* cited by examiner

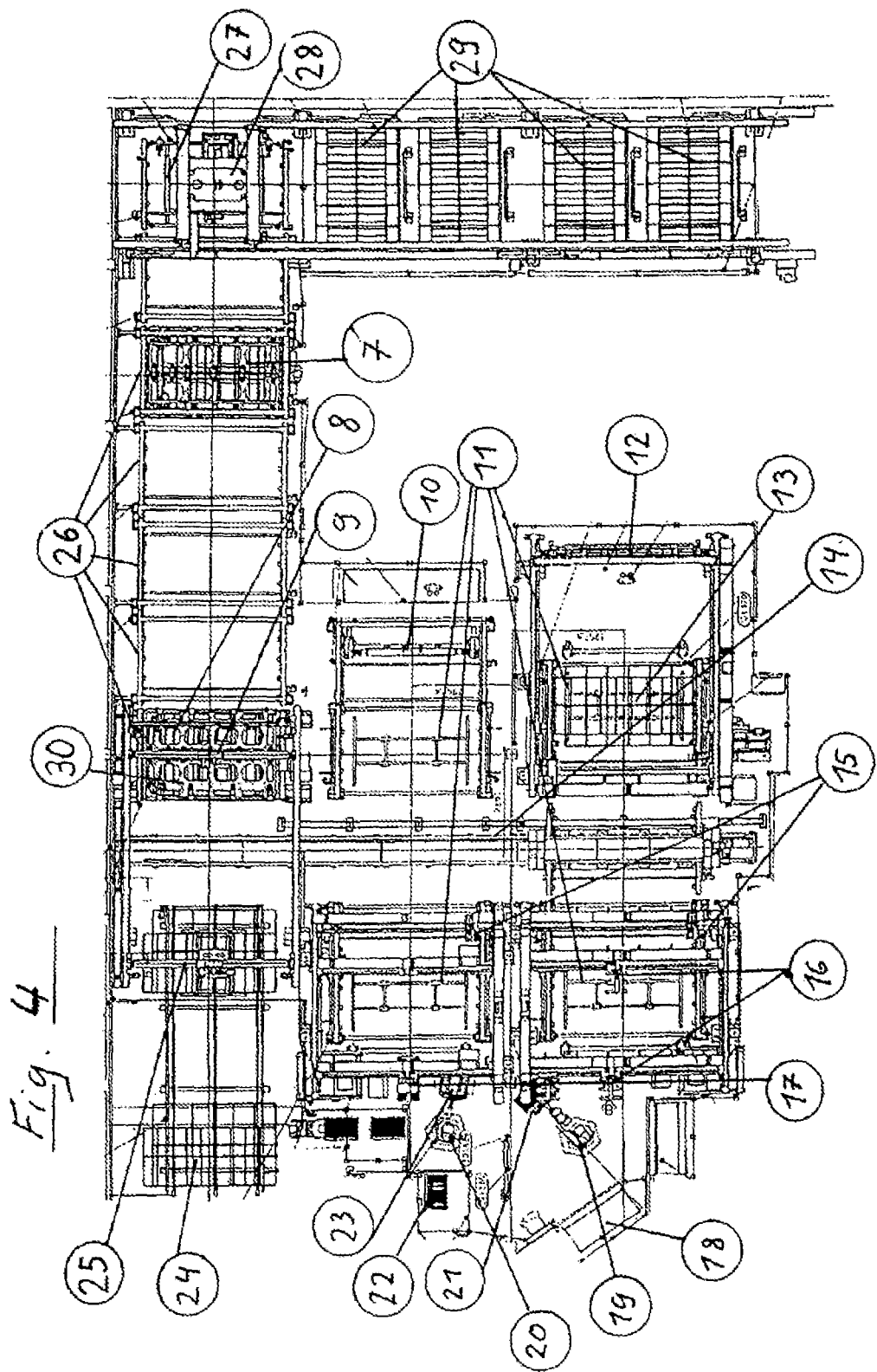

Fig. 4-B
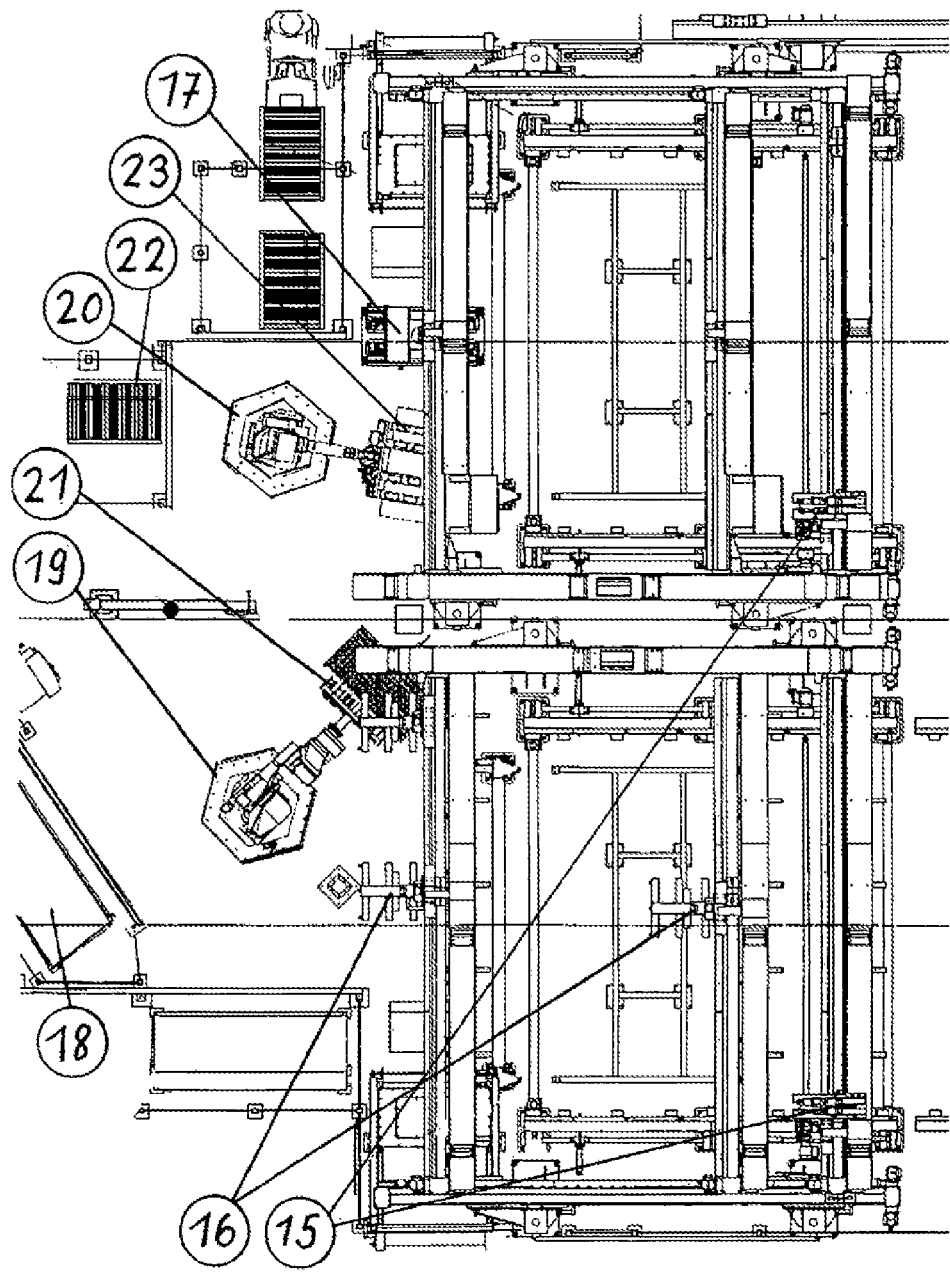

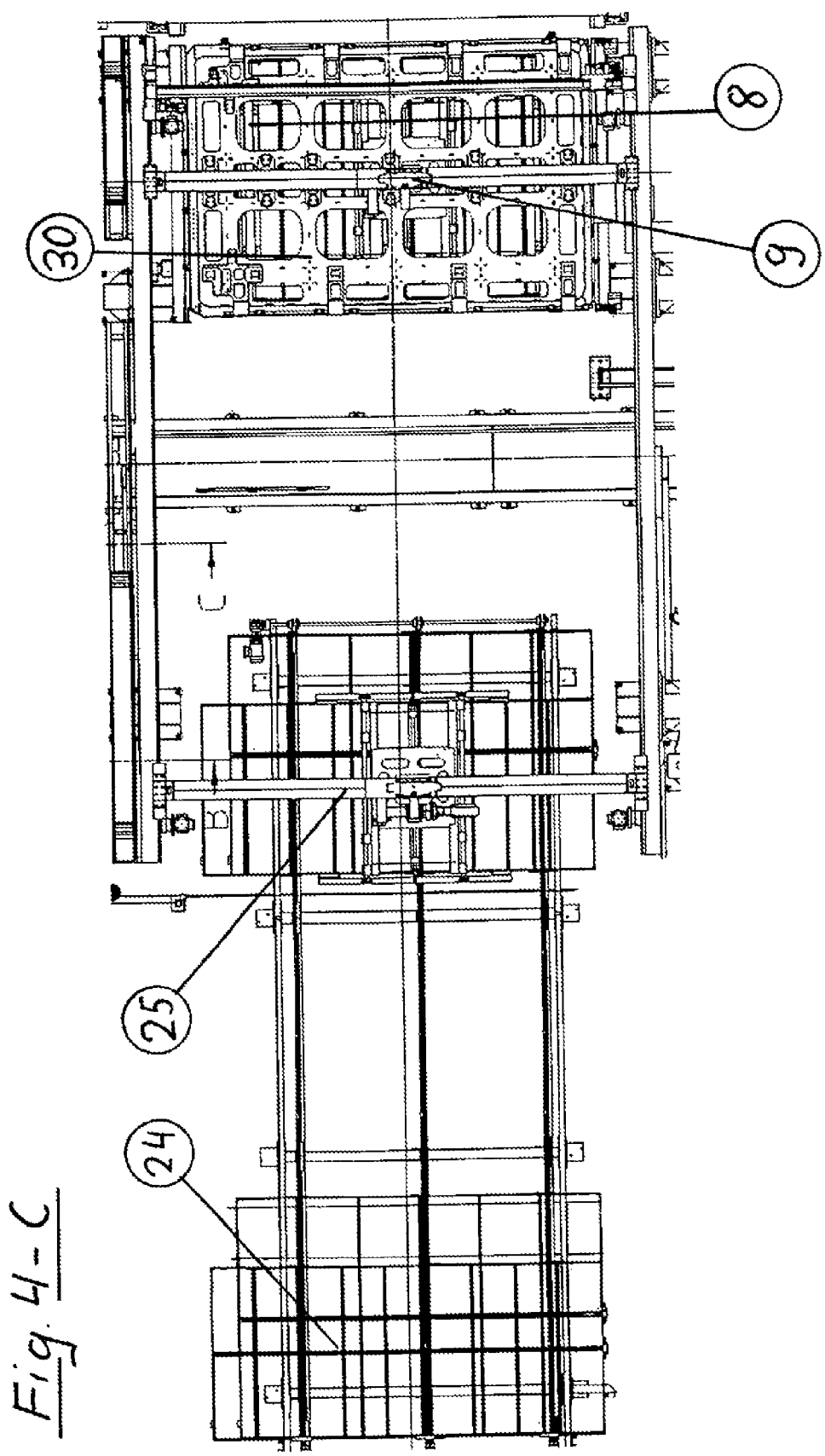
Fig. 4-C

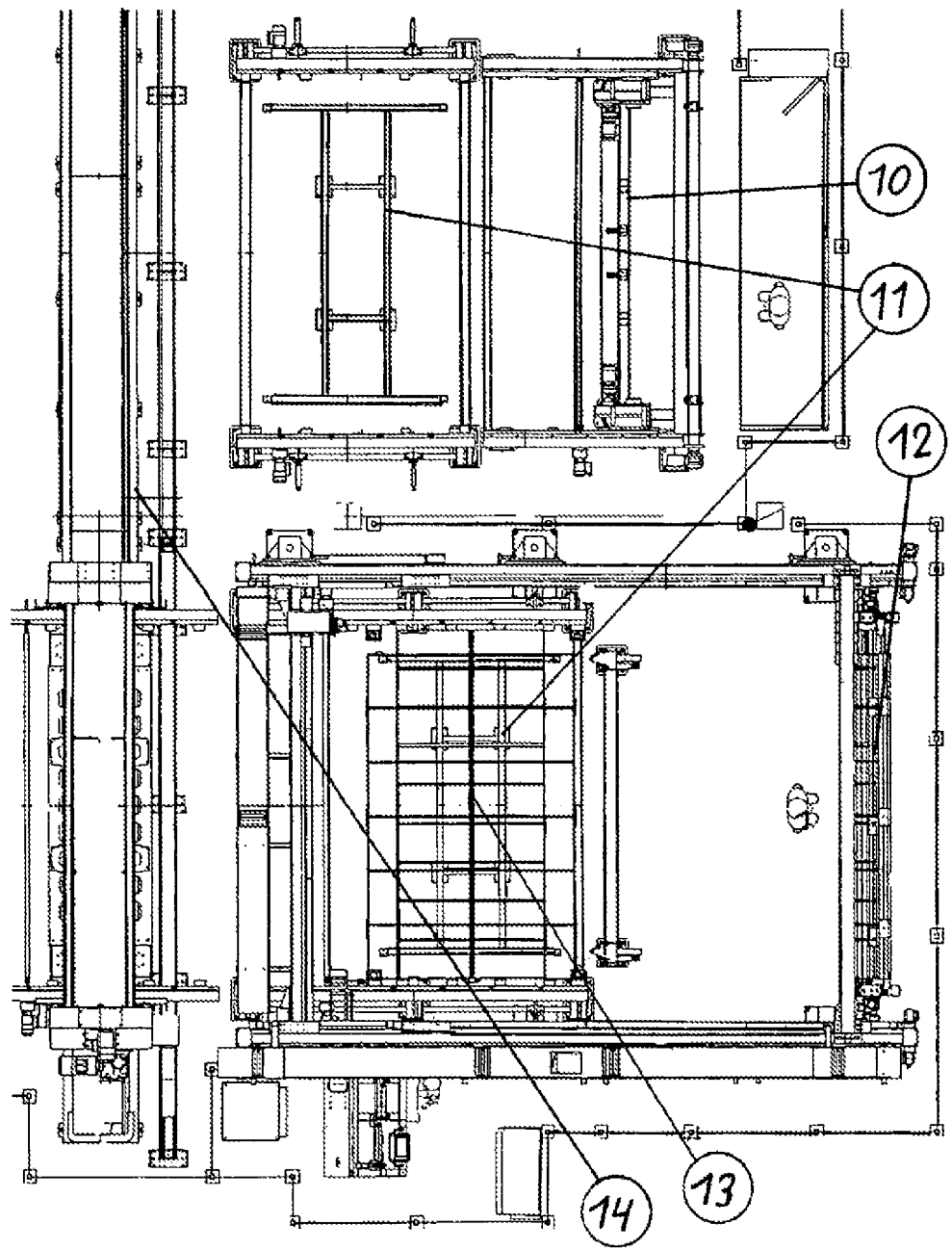
Fig 4-D

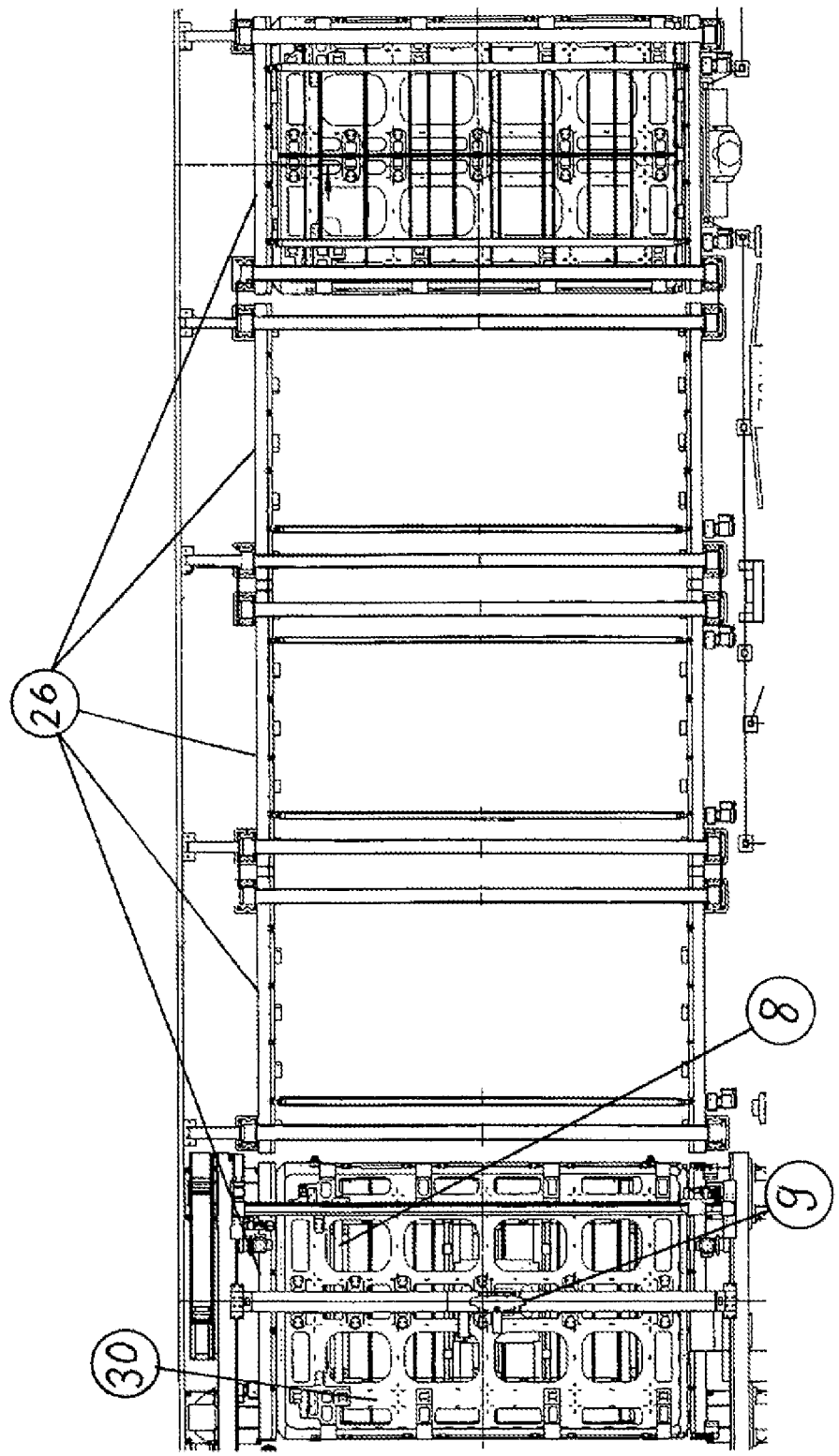

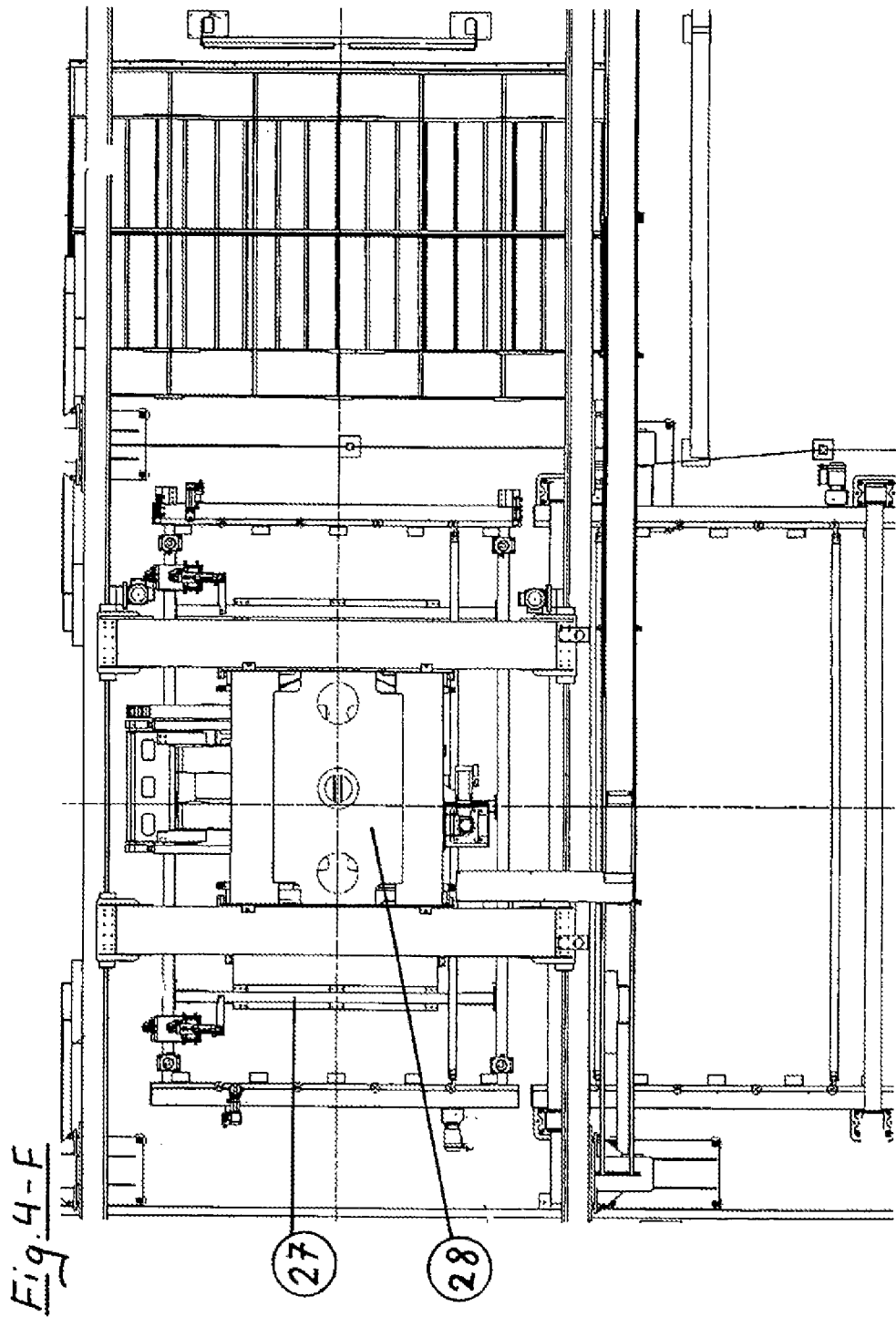

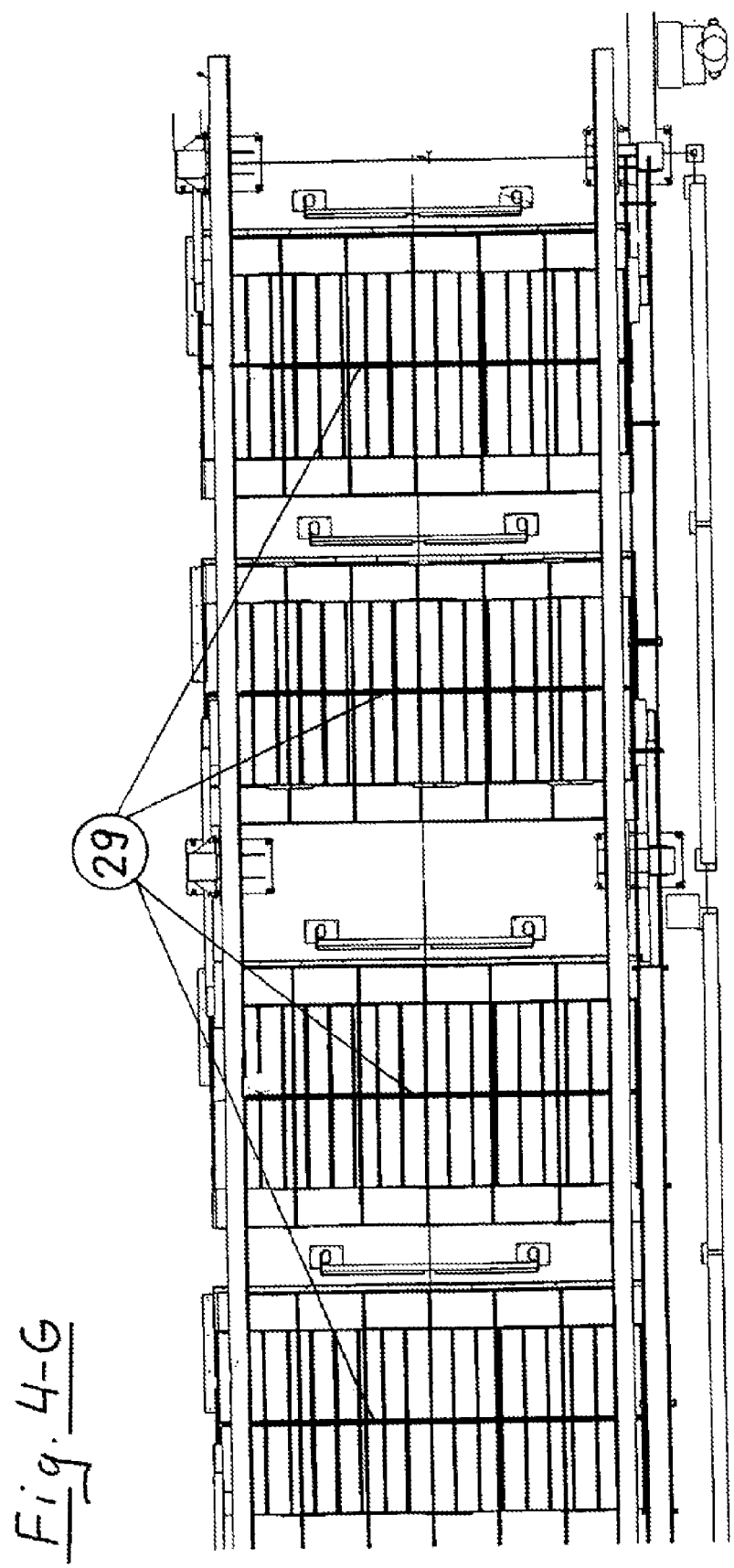
Fig. 4-G

Fig. 9
a
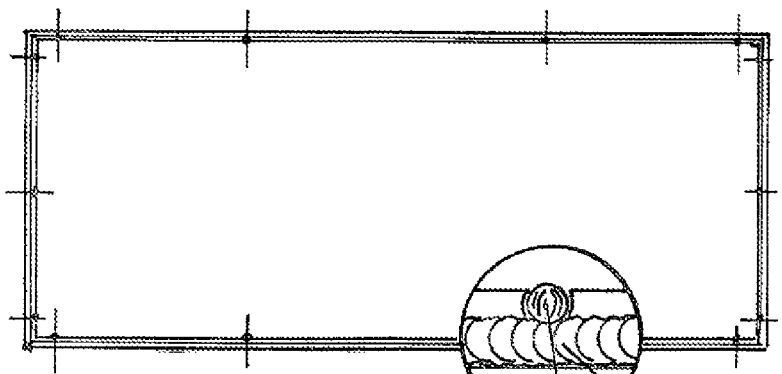
b
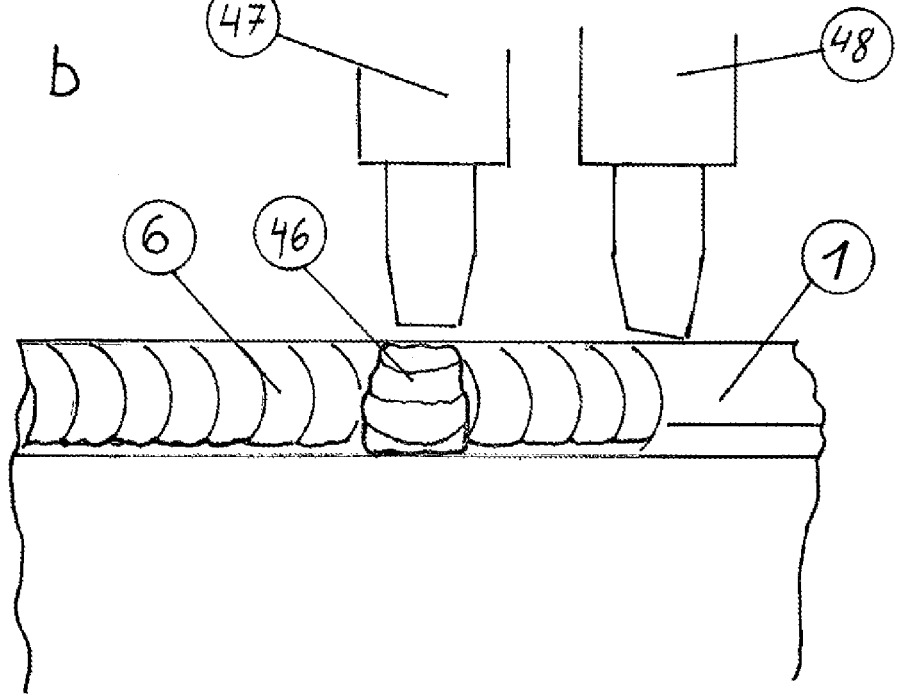

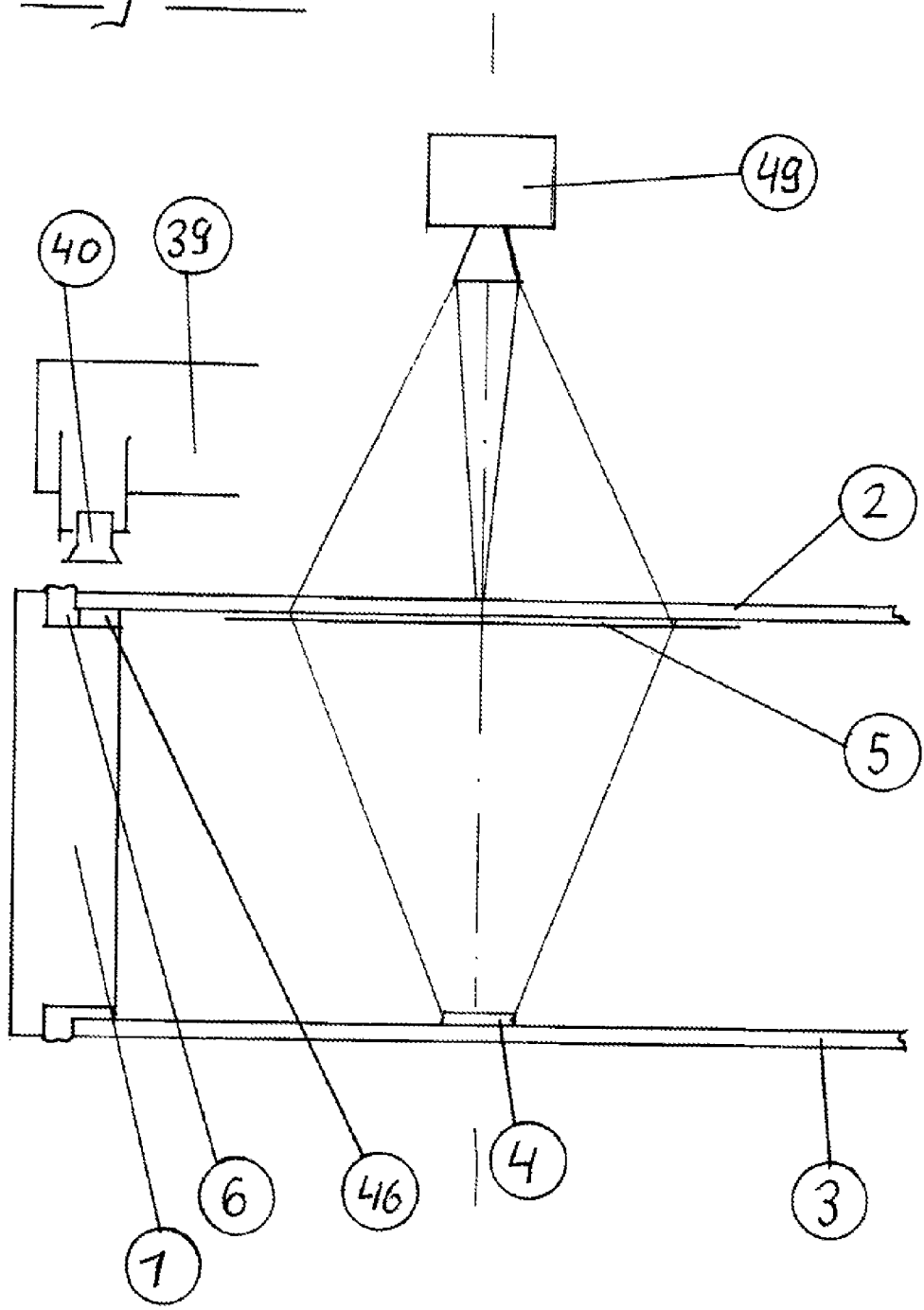

METHOD AND DEVICE FOR INDUSTRIALLY PRODUCING PHOTOVOLTAIC CONCENTRATOR MODULES

CROSS-REFERENCE TO RELATED APPLICATIONS

This application is a §371 national stage entry of International Application No. PCT/DE2012/001160, filed Dec. 6, 2012, which claims priority to German Application No. 20 2011 108 836.0 filed Dec. 8, 2011.

There have already been approaches for many years in the field of photovoltaics for working with concentrated solar radiation. In this case, the radiation of the sun is concentrated by means of mirrors and/or lenses and is directed onto special concentrator solar cells. Corresponding concentrating photovoltaics (CPV) systems are currently being tested at the Spanish Institute for Concentration Photovoltaic Systems (IS-FOC) at Castilla in Puertollano. The sunlight is bundled using lenses or mirrors to four hundred to one thousand times intensity before it hits small solar cells which are much more efficient than conventional silicon solar cells. Producers from many parts of the world have installed CPV modules on the test sites there. Approximately one thousand modules are currently installed on the site. The researchers are developing profit forecasts, inter alia, and are testing the long-term stability in order to facilitate the transition of this technology from development to market.

Only few CPV systems were previously operational worldwide. The total output thereof of approximately 30 megawatts corresponds approximately to the output of three nuclear power plants. A current study carried out by the American market research institute Greentechmedia Research predicts good career prospects however for this technology. Accordingly, the CPV output installed per year could already lie at 1,000 megawatts from 2015. Under favorable conditions, each kilowatt hour of power from CPV systems costs between 18 and 21 cents according to a study carried out by the Fraunhofer Institute for Solar Energy Systems (ISE) in Freiburg. This is calculated with firm expectations of further cost reductions due to more efficient components and well-developed industrial production.

The centerpiece of the systems is constituted by the high-power solar cells which are currently used primarily in outer space. There, they have already been supplying satellites and robots with power for years. Instead of silicon, these cells contain what are known as compound semiconductors made of gallium, indium, arsenic or phosphorous. They consist of a number of different semiconductor layers, a different range of the sunlight spectrum being processed by each of said layers, whereas conventional silicon cells can convert only a smaller part of the sunlight spectrum into electrical power. Reference is made to the following prior art from the patent literature.

U.S. Pat. No. 4,834,805 A discloses a photovoltaic power module having the following features.

An arrangement of photovoltaic semiconductor crystal cells, distributed in individual cell locations in a layered substrate, wherein they are enclosed by two electrically conductive layers and are separated by means of an insulating layer. This module further consists of a light-conveying layer formed of lenses, which is arranged at a distance from the layered substrate, wherein incident radiation in the light-conveying layer is focused by means of lenses into the substrate, and wherein the thickness of the lens layer, of the substrate layer and of the space therebetween is less than 2 inches.

DE 10 2006 007 472 A1 discloses a photovoltaic concentrator module comprising a lens pane and a base pane, on which solar cells are accommodated, and a frame, wherein the frame is arranged peripherally along the edge of the lens pane and the base pane in a manner connecting the lens pane and the base pane.

This known concentrator module is to be improved to the effect that it can be produced cost-effectively, is durable, and allows simple and flexible integration of additional components which cannot be accommodated on the lens pane or the base pane or can only be accommodated thereon with difficulty. In addition, a method is to be developed which enables the production of such concentrator modules.

The problem addressed here is solved in that, on the one hand, at least one first sealing compound and/or adhesive compound is arranged along the frame between the lens pane and the frame and/or the base pane and the frame, and, on the other hand, at least one second sealing compound is arranged peripherally at least over part of the length of the frame, wherein the two sealing and/or adhesive compounds differ in terms of their curing time and/or gas permeability. A method for producing a photovoltaic concentrator module as claimed in one of the preceding claims is claimed in claim 57 and is characterized by the following features.

Specifically, in that a frame connecting a lens pane and a base pane is arranged along the edge of the lens pane and the base pane, and in that, on the one hand, at least one first sealing compound and/or adhesive compound is arranged between the frame and the lens pane and/or the frame and the base pane, and, on the other hand, at least one second sealing compound is introduced peripherally along the frame over at least part of the length thereof, wherein the two sealing and/or adhesive compounds differ in terms of their curing times and/or gas permeabilities. The focus here is indeed on a first sealing compound and/or adhesive compound and a second sealing compound, however the fact that one of the adhesive compounds serves merely to fix a plate during the production process by means of UV light, whereas another durable adhesive compound is used to provide a primary seal, cannot be inferred here.

The problem addressed by the device and the corresponding method according to the invention is that of presenting a device and a method with which concentrator modules can be industrially produced economically and reliably.

This object is achieved by a device as claimed in claim 1:

A device for industrially producing photovoltaic concentrator modules consisting of a module frame, a lens pane having a plurality of Fresnel lenses, a sensor carrier pane, and an electric line guide, comprising the following features:

a) a carriage (30) for holding a module frame (1) in a tension-free manner by means of clamping elements (31) on both longitudinal sides and stop elements (37) on both transverse sides, wherein the clamping elements (31) are adjusted by displacing and rotating a control rod (32), b) an arrangement (47) for applying acryl in dots and an arrangement (48) for applying silicone in lines onto the support surfaces of the module frame (1), c) an arrangement for laying the sensor carrier pane (3) or the lens pane (2), wherein these panes are transported in a tension-free manner by means of special suction devices (39) and are set down with a centrally-positioned predetermined contact pressure, d) an arrangement for measuring the respective pane position and for positioning the sensor carrier pane (3) or the lens pane (2), e) an arrangement for finely adjusting the lens pane (2) relative to CPV sensors (4) of the sensor carrier pane (3), wherein a voltage is applied to selected CPV sensors, whereupon the light emitted therefrom via the Fresnel lenses (5) is detected and the lens pane (2) is adjusted in such a way that the emission from particularly strategically important Fresnel lenses (5) is at a maximum, f) an arrangement for curing the applied silicone between the module frame (1) and the respective pane by means of a plurality of UV light emitters (40), g) arrangements for transporting the workpieces to be processed.

Claim 2:

The device as claimed in claim 1, characterized in that the suction device (39) for transporting the panes is designed such that each sucker head (45) consists of solid material and the area delimited by a ring seal (44) is flat and arbitrarily shaped.

Claim 3:

The device as claimed in one of the preceding claims, characterized in that the basic adjustment of the clamping elements (31) is performed by displacing a control rod (32), via an eccentric (35) fastened on the control rod and a spline (33) contacted thereby.

Claim 4:

The device as claimed in one of the preceding claims, characterized in that, as the carriage (30) holds a module frame tension-free manner, the compressive forces occurring are detected by means of sensors and the desired compressive forces are automatically adjusted by means of the control rod (32) and four servomotors (50) on each longitudinal side and by the method as claimed in claim 5:

A method for industrially producing photovoltaic concentrator modules consisting of a module frame, a lens pane comprising a plurality of Fresnel lenses, a sensor carrier pane and an electric line guide, comprising the following features:

a) a carriage (30) is provided, a module frame (1) is set down and is held in a tension-free manner on the transverse sides by means of stop elements (37) and on the longitudinal sides by means of clamping elements (31), b) the carriage (30) is moved by means of a transverse conveying arrangement (14) to an arrangement (47) for applying acryl in dots and an arrangement (48) for applying silicone in lines, wherein the acryl and the silicone are applied to the upper support surface of a module frame (1), c) the sensor carrier pane (3) is then laid onto the module frame (1) by means of a transfer robot (19) and a laying arrangement (16), wherein these convey the sensor carrier pane (3) in a tension-free manner by means of special suction devices (39), the sensor carrier pane is set down and positioned with a centrally positioned predetermined contact pressure, and then the acryl dots for fixing are cured by means of UV light emitters (40), d) the module frame (1) is removed from the carriage (30), is brought into a vertical position, provided with an electric distribution box and flat ribbon cable in accordance with the connections, and is then moved in a horizontal position in a carriage (30) by means of the transverse conveying arrangement (14) to the arrangement (47) for applying acryl in dots and the arrangement (48) for applying silicone in lines, wherein the acryl and the silicone are applied to the second, now upper, support surface of the module frame (1), e) the lens pane (2) is laid onto the module frame by means of a transfer robot (20) and a laying arrangement (17), wherein these convey the lens panes (2) in a tension-free manner by means of special suction devices (39), f) the lens pane (2) is then finely adjusted relative to the alignment with corresponding CPV sensors (4) of the sensor carrier pane (3), wherein a voltage is applied to selected CPV sensors, whereupon the light emitted therefrom via the Fresnel lenses (5) is detected and the lens pane (2) is adjusted in such a way that the emission from particularly strategically important Fresnel lenses (5) is at a maximum, g) a centrally positioned predetermined contact pressure is then applied to the lens pane (2), and the acryl dots for fixing are cured by means of UV light emitters (40), h) the finished concentrator modules are then given time for the silicone to cure, and a quality-oriented sorting process, packaging and dispatch are then performed.

Claim 6:

The method as claimed in claim 5, characterized in that the compressive forces occurring on the longitudinal sides of a module frame (1) are detected by means of sensors, and the desired compressive forces at the clamping elements (31) are adjusted in an automated manner.

Claim 7:

A control program with a program code for carrying out the method steps as claimed in claim 5 or 6 if the program is run in a computer.

Claim 8:

A machine-readable carrier with a program code of a control program for carrying out the method as claimed in claim 5 or 6 if the program is run in a computer.

The device according to the invention will be described hereinafter in greater detail. In the drawings more specifically:

FIG. 1: shows a module frame 1 in plan view

Figure 2:
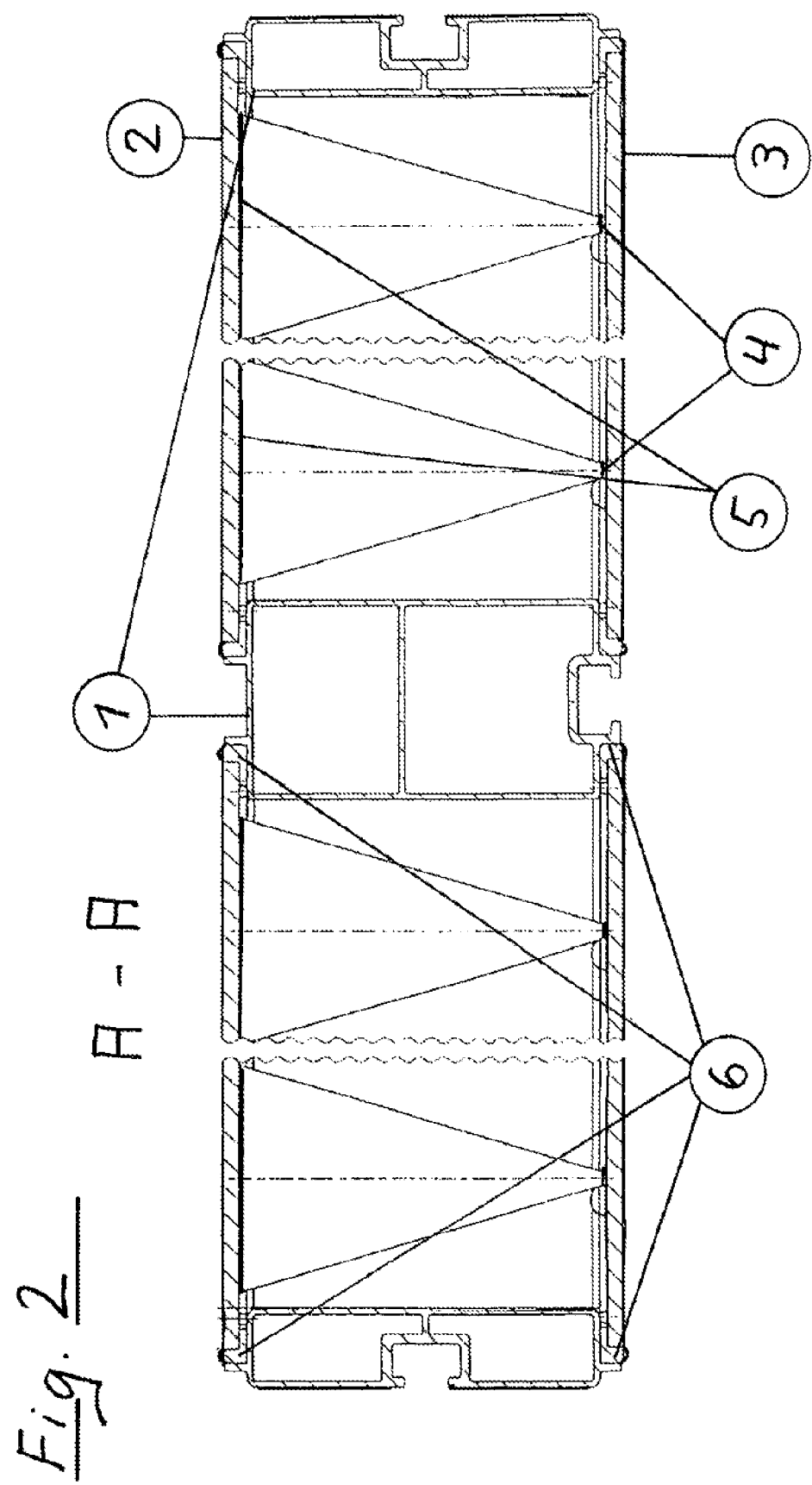

FIG. 2: shows a concentrator module in cross section

Figure 3:
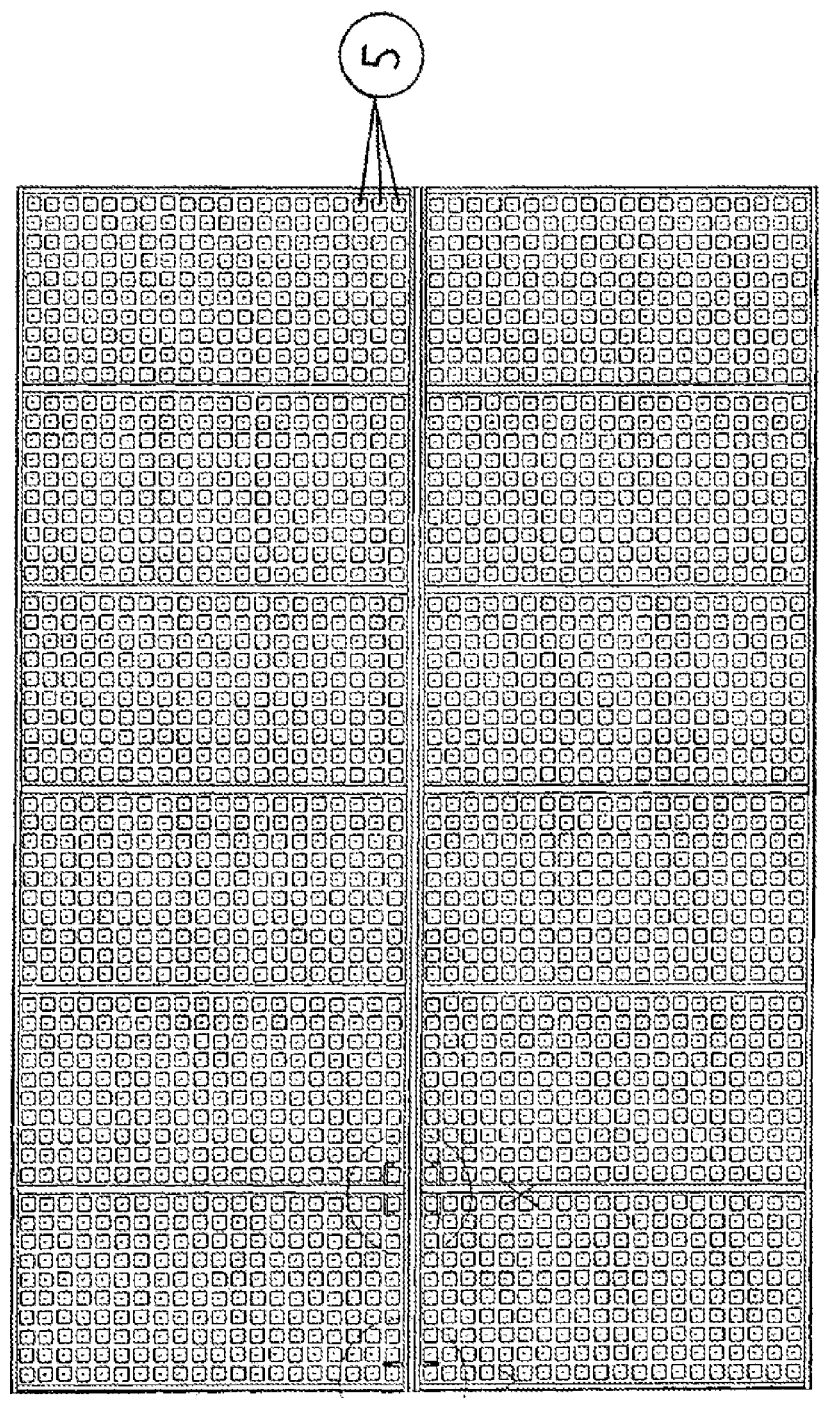

FIG. 3: shows a lens pane with Fresnel lenses 5

Figure 5:
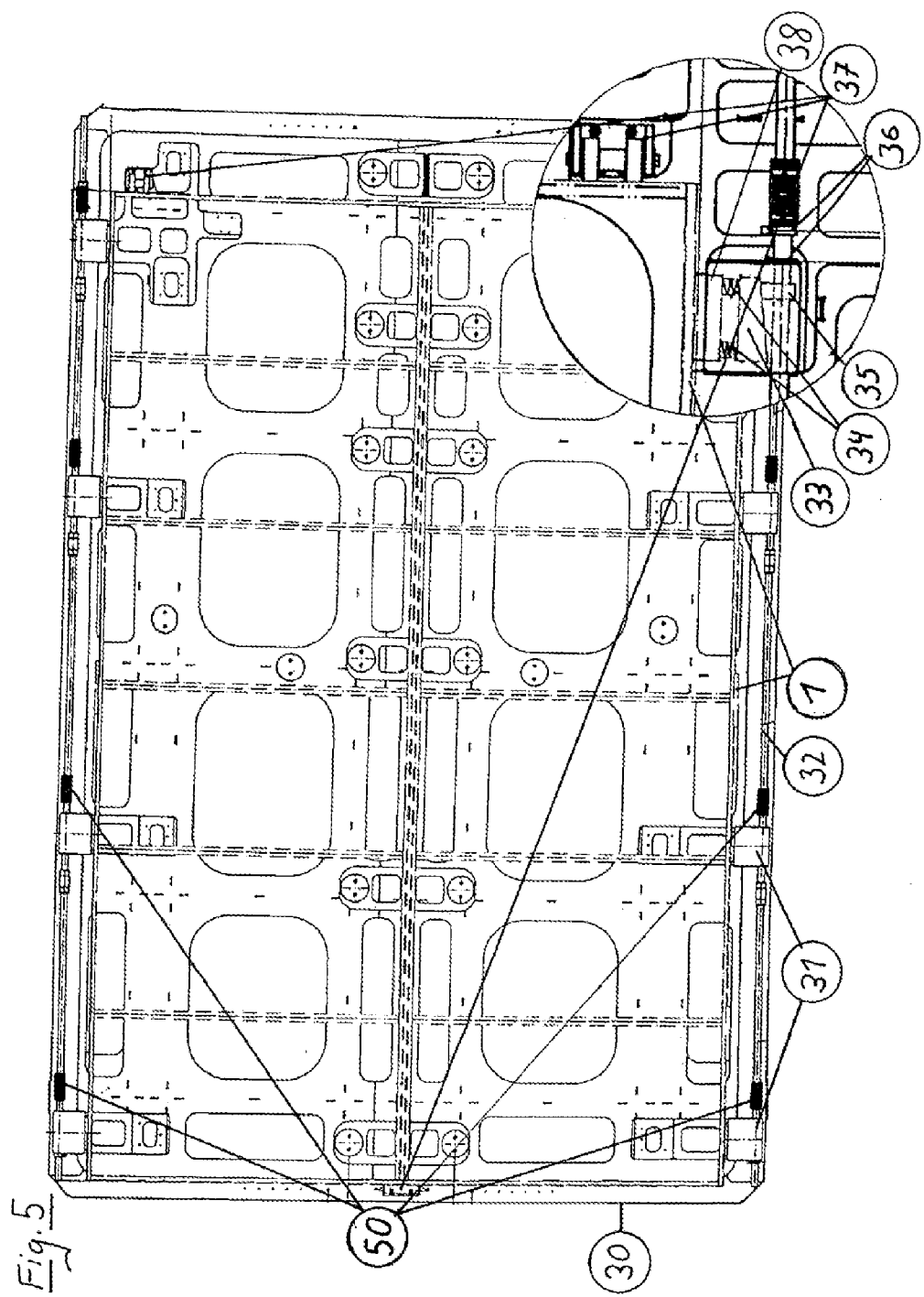

FIG. 4: shows an overview of a manufacturing facility according to the invention FIG. 5: shows a plan view of a carriage 30

Figure 6:
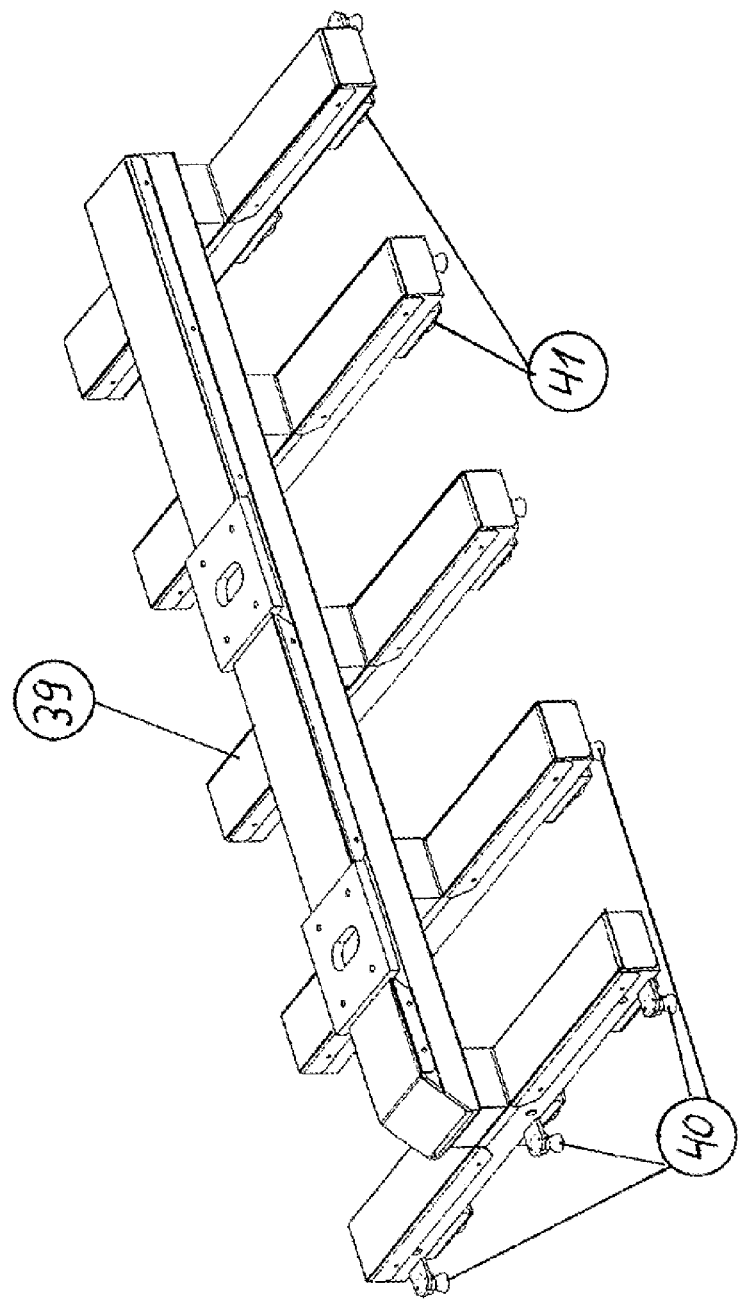

FIG. 6: shows an illustration of a laying arrangement

Figure 7:
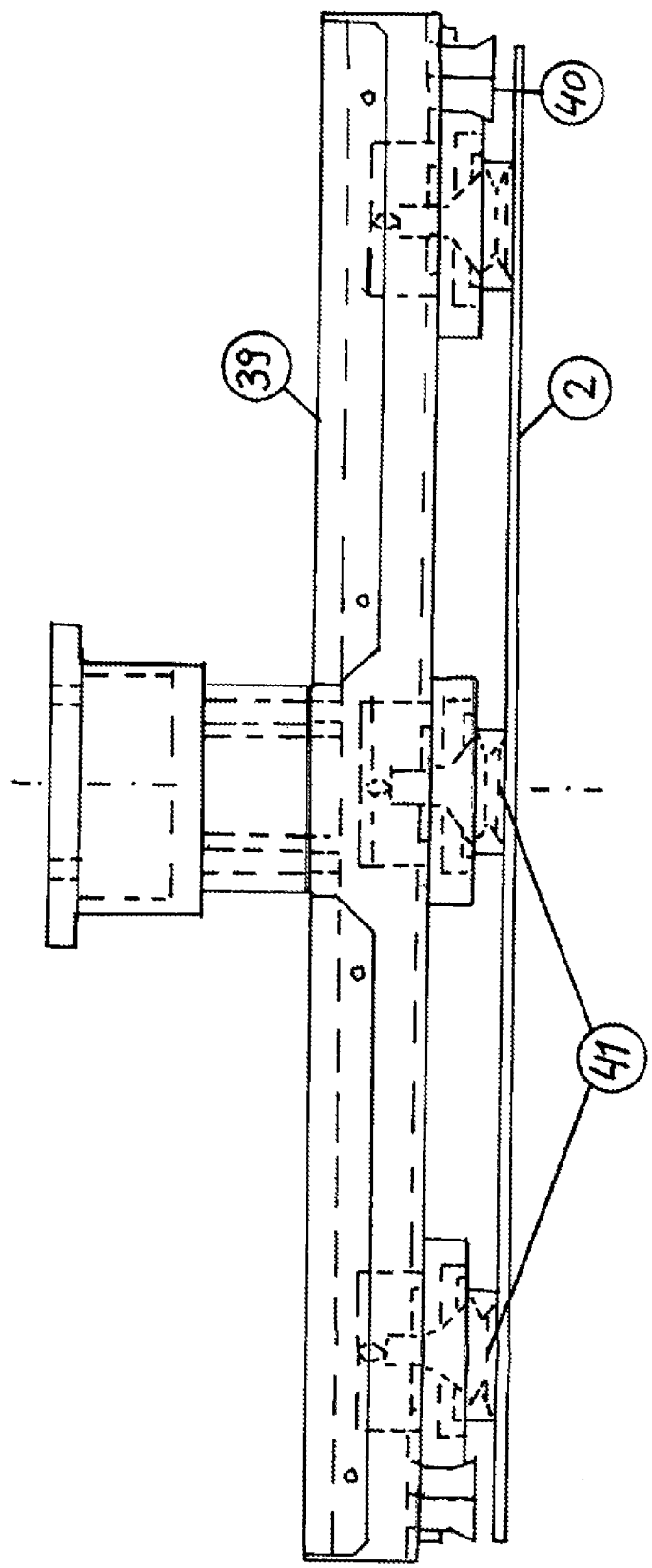

FIG. 7: shows a cross section of a sucker carrier 39

Figure 8:
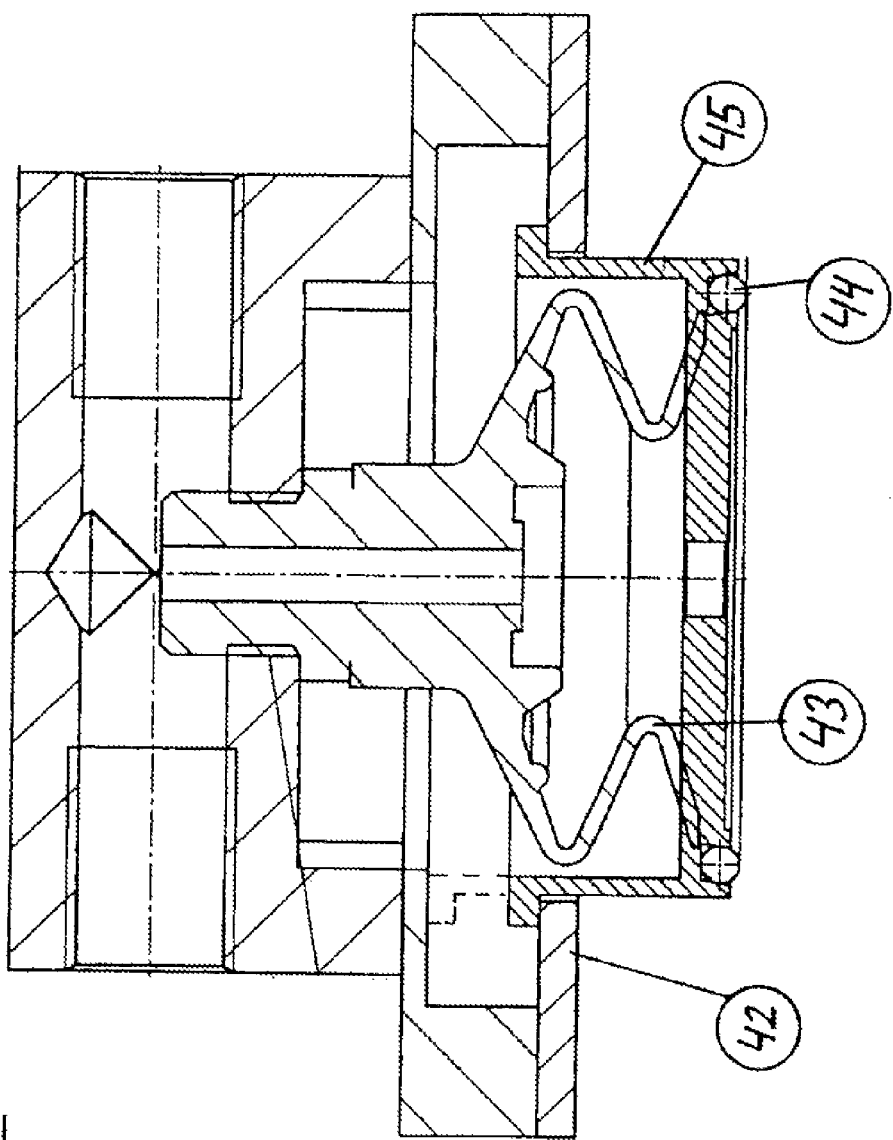

FIG. 8: shows a cross section of a sucker 41

FIG. 9: shows an explanatory illustration of an adhesion procedure

FIG. 10: shows an explanatory illustration of the fixing of a sensor carrier pane.

A module frame (1) is shown in plan view in FIG. 1. The line of section A-A constitutes the viewing direction from a side view, which can be seen in FIG. 2. The module frame is divided by transverse webs into the shown fields.

FIG. 2 shows a concentrator module with its supporting module frame (1) in cross section in an enlarged view. Here, a lens pane 2 on the upper face and a corresponding sensor carrier pane 3 as a base pane on the lower face can be seen. The module frame 1 is illustrated here in a manner interrupted on each side in its transverse extent in order to be able to show the shown details true to size. On the right-hand side, references to the used Fresnel lenses 5 can be found in the lens pane 2, and references to the corresponding CPV sensors 4 can be found in the sensor carrier pane. The regions of application of a silicone seal 6 are also labelled clearly in FIG. 2 on the left-hand side.

FIG. 3 shows a lens pane with all Fresnel lenses (5) incorporated in this size of a module frame 1. Three of these Fresnel lenses 5 are denoted separately on the right-hand side. On the left-hand side, the connections of the flat ribbon cable are illustrated in the indicated circles and bring together the entire current of the individual CPV sensors 4 of each of the shown fields and are routed in the center along a module frame 1.

FIG. 4 provides an overview of a fabrication facility for industrial production of photovoltaic concentrator modules.

A magazine 24 for module frames 1 can be seen in the left upper corner of FIG. 4. Reference sign 25 further denotes adjacently a portal re-positioning device for module frames 1. The portal re-positioning device 26 carries module frames 1 from the magazine 24 and forwards these to a laying arrangement 9. Here, a lifting table 8 with 5 levels is used. This laying arrangement 9 then sets down one module frame 1 at a time onto a carriage 30, which together on the transverse conveyor 14 are moved to the device 15 for applying acryl 46 and silicone 6. Here, acryl dots and a corresponding silicone bead are applied to the upper side of the module frame 1.

A sensor carrier pane 3 is then set down as a base pane. The magazine 18 for sensor carrier panes 3, the transfer robot 19 for sensor carrier panes 3 and the laying arrangement 16 for sensor carrier panes 3 are involved in this procedure. The sensor carrier pane 3 is set down centrally on the respective pane by means of the device 16, is pressed thereagainst by a predetermined contact pressure, and is then fixed to the module frame 1 by the curing of the acryl dots by means of UV light. Such a fixing cannot be inferred from the prior art. The corresponding production procedures will be explained later in greater detail.

The carriage 30 with the module carrier 1 thus equipped is moved for mechanical or automatic contacting 13 depending on the development stage. There, the module frame is removed from the carriage 30, rotated from the horizontal position into a vertical position, and conveyed to the station 12 for manual contacting. Here, a distribution box for the electric connection lines is basically incorporated. The following electric connection of the CPV sensors to the distribution box can be performed manually or automatically. The module frame 1 is then rotated again into a horizontal position, such that the sensor carrier pane 3 is arranged underneath, and is fastened on a carriage 30.

The carriage 30 with the module carrier 1 thus equipped is then moved to the device 15 for applying acryl 46 and silicone 6. Here, acryl dots and a corresponding silicone bead are applied.

A lens pane 2 is then set down. The magazine for lens panes 22, the transfer robot 20 for lens panes, and the laying arrangement 17 for lens panes are involved in this procedure. The corresponding production procedures will be explained later in greater detail. The individual processing stations are equipped with lifting tables 11. These lifting tables 11 serve to transport carriages 30 and module carriers 1 in a friction-free manner during the operational procedure and enable the intermediate storage of components in an intermediate level.

For faultless function of the concentrator module, an exact alignment of the Fresnel lenses 5 with the corresponding CPV sensors 4 is necessary. The lens panes 2 are adjusted by means of a camera (49). The technical procedure for this purpose will be explained later.

After the fine adjustment of a lens pane 2, the lens pane 2 is fixed by curing the acryl dots by means of irradiation with a UV light emitter 40 (see FIG. 6). The carriage 30 is then moved to the station 10, where it is brought into a vertical position. The excess silicone is then removed manually or automatically from the vertically oriented carriage 30.

The carriage 30 thus processed is moved from the station 10 by means of the transverse conveyor 14 to a quality check.

After the quality check, the corresponding carriage 30 is moved into the storage station 26, which has spaces in a number of levels, wherein a level is also provided for empty pallets. Here, the silicone has the necessary time to cure.

After the curing time, each concentrator module is provided with a barcode and is brought by means of a lifting table 27 and a portal re-positioning device 28 to stacking spaces 29, which allow a classification in accordance with quality grades.

FIG. 5 shows a plan view of a carriage 30. The dashed lines here denote a set-down module frame 1. The module frame 1 is fastened here on the upper longitudinal side by means of the same clamping elements 31 as are denoted on the lower longitudinal side in detail. A clamping piece 37 is provided on the left-hand broad side in the middle at the point of the reinforced middle web of the module frame 1 and corresponds to the two clamping pieces 37 denoted on the right-hand broad side. These clamping pieces have a conically chamfered sliding face which enables an accurately fitting insertion and easy removal of a module frame 1 from above by means of a gripper. In the detailed illustration shown in an enlarged manner in a circle, the functional principle of a clamping device can be seen by way of example. The right-hand lower corner of the module frame 1 is shown in an enlarged manner in the upper half of this circle. The clamping element 31, likewise shown in an enlarged manner and formed for example in a square manner, makes it possible to see a control rod 32 common to all four clamping elements 31 on this side.

The operating principle provided here will be explained hereinafter in greater detail.

An eccentric 35 sits on this control rod 32 and acts on a chamfered spline 33, which in turn is connected via two compression springs 34 to a stop element 37, which presses onto the module frame 1. If the control rod 32 is displaced to the left in this case, the eccentric 35 also displaces to the left and, sliding along the spline 33, presses the compression springs 34 together, which forward this pressure resiliently to the module frame 1. The two magnets 36 are interconnected and therefore for example fix this basic adjustment.

This basic adjustment can be performed manually or in an automated manner.

For an automated displacement of the control rod 32, many possibilities are known to a person skilled in the art and therefore will not be described in greater detail.

A further adjustment possibility of this arrangement, illustrated in principle, lies in rotating the control rod 32 and thus performing an additional adjustment, in particular a fine adjustment, via the rotation of the eccentric 35.

This can also be implemented manually or in an automated manner.

For the purpose of an automated adjustment, the control rod 32 can be rotated at the denoted point, in addition to the described displacement, by means of the illustrated servomotor 50 on the right-hand side of a clamping element 31. The sleeve shown on the other side of a clamping element 31 serves to compose the control rod 32 during the fabrication process. Such servomotors 50 are located in this case on each clamping element 31. This adjustment option makes it possible, in addition to a specific basic adjustment, whether performed manually or in an automated manner, to adjust the contact pressure of each clamping element 31 individually in an automated manner. The same individual contact pressure can thus be set at each point of the longitudinal side of a module frame 1 by means of these clamping elements 31 via corresponding distance sensors and corresponding pressure sensors, not shown and denoted here for reasons of clarity. The same clamping elements 31 are installed on the other longitudinal side with the described devices. As a result of this measure, even very slight deformations of the side walls of a module frame 1 can be automatically taken into consideration during the clamping process, and therefore a completely tension-free mounting of a module frame 1 is ensured, and each lens pane 2 and a sensor carrier pane 3 can therefore be connected completely without tension to a module frame 1. This measure ensures that the forces which act on the adhesive bond of these panes with large temperature differences can be minimized. A very low stressing of the adhesive bond of a concentrator module and an increase of the service life thereof are thus produced, even under difficult climatic requirements.

FIG. 6 shows an illustration of a laying arrangement having 5 sucker carriers 39, as part of a transfer procedure by means of a transfer robot 19 for sensor carrier panes 3, or by means of a transfer robot 20 for lens panes 2. Here, a transfer robot generally has 4 suction carriers on one side, with which he detects a pane on one side and transfers this to a laying arrangement. A laying arrangement generally has 5 suction carriers 39. A pane is transferred by means of a transfer robot in that the pane is held on one side by means of 4 suction carriers, is slid from the transfer robot into the four gaps between a suction carrier of a transfer unit having five suction carriers 39, and is then suctioned on both sides by the transfer unit. These sucker carriers 39 each carry, at their two ends, suckers 41 and UV light emitters 40, wherein UV light emitters 40 are also attached in the middle of each suction carrier 39.

FIG. 7 shows a cross section of a sucker carrier 39. In addition to the illustration in FIG. 6, a received sensor carrier pane 2 is shown here. The two UV light emitters 400 to the left and right can be seen here in cross section. The middle UV light emitters 40 are hidden.

FIG. 8 shows a cross section of a sucker 41. In this illustration the special effect of this sucker can be seen. Since it is important in the case of the panes to be received, particularly with the sensor carrier pane 3, that these are transported and applied absolutely in a planar position, the area of each sucker head with which the respective pane is contacted by the respective sucker head must also be absolutely flat. This is achieved in that, in the shown illustration, the ring seal 44 is guided in a sucker head 45 made of solid material. Here, the sucker head 45 slides together with the rubber bellows 43 in the retaining pane 42. An undulating deformation of the received pane at the points of action of the respective sucker, as is feared with other embodiments in the prior art with flexible lip seal, is ruled out in this case. Here, the sucker head 45 may also be approximately square for example or may have any other flat shape which induces minimal mechanical stress in the received pane. For example, in this context an elliptically shaped area may contribute to a reduction of the stresses in the respective pane at it is received and transported.

FIG. 9 shows an explanatory illustration of an adhesion procedure. A detailed view of the peripheral edge of a module frame 1 can be seen in FIG. 9a and shows a circular detailed view at one point. Here, the edge of a module frame 1 and the adjacent application of a silicone bead 6 can be seen here in the detail. An acryl dot 46 can also be seen closely beside this silicone seal 6.

An acryl application arrangement 47 and a silicone application arrangement 48 are additionally shown in side view in FIG. 9b.

FIG. 10 provides an explanatory illustration of the fixing of a sensor carrier pane 3. Besides part of the cross section of a module frame 1, a sensor carrier pane 3 and a lens pane 2, an acryl dot 46 and the silicone seal 6 are also shown. A suction carrier 39 and a UV light emitter 40 are illustrated in a stylized manner on the left-hand side. The lens pane 2 is aligned by means of a camera 49 and then fixed by means of the curing of corresponding acryl dots 46, such that the centerpoint of all Fresnel lenses 5 are directed exactly toward the center of the corresponding CPV sensors.

This alignment can be performed purely optically by adjusting the lens pane 2 in such a way that the position of the optical axis of the Fresnel lenses 5 thereof contact the geometric centerpoint of corresponding CPV sensors.

This alignment can also be performed differently however, specifically by applying voltage to selected CPV sensors themselves, whereupon the light emitted therefrom via the Fresnel lenses is detected and the lens pane 2 is adjusted in such a way that the emission of particularly strategically important Fresnel lenses 5 is at a maximum. An arrangement for detecting the respective pane position of a lens pane 2 relative to the position of the sensor carrier pane 3 and for detecting the positioning mechanisms is necessary for this purpose. A person skilled in the art is familiar with such arrangements, and these therefore are not illustrated. The control signals of such an arrangement are used to control the transfer robot 19 for sensor carrier panes 3.

The control of the complex movement processes and the signal processing of the used sensors require a special control program.

LIST OF REFERENCE SIGNS 1 module frame
2 lens pane
3 sensor carrier pane (base pane)
4 CPV sensors
5 Fresnel lenses
6 silicone seal
7 test station for seal test, labelling
8 front lifting table for the carriages (5 levels)—see 27
9 laying arrangement for module frames (on carriage)
10 station for post-processing (silicone removal)
11 lifting tables of the processing stations (2 levels)
12 station for manual contacting (processing)
13 station for mechanical automatic contacting
14 transverse conveying arrangement for carriages
15 device for applying acryl and silicone
16 laying arrangement for a sensor carrier pane 3
17 laying arrangement for the lens pane 2
18 magazine for sensor carrier pane
19 transfer robot for sensor carrier panes
20 transfer robot for lens panes
21 suction gripper for sensor carrier panes (robot transfer)
22 magazine for lens panes
23 suction gripper for lens pane (robot transfer)
24 magazine for module frames
25 portal re-positioning device for module frames
26 storage stations (4 levels)
27 rear lifting table for carriages (5 levels) see 8
28 portal re-positioning device for end stacking (4 spaces)
29 stacking spaces (4 quality grades)
30 carriage as support for module frames 1
31 clamping element 32 control rod
33 spline
34 compression spring
35 eccentric
36 magnet
37 stop element
38 clamping piece
39 sucker carrier
40 UV light emitter
41 sucker
42 holding plate
43 rubber bellows
44 ring seal
45 sucker head
46 acryl
47 acryl application arrangement
48 silicone application arrangement
49 camera
50 servomotor

The invention claimed is:

1. A device for industrially producing photovoltaic concentrator modules comprising of a module frame, a lens pane having a plurality of Fresnel lenses, a sensor carrier pane, and an electric line guide, comprising the following features:
 h) a carriage for holding a module frame in a tension-free manner by means of clamping elements on both longitudinal sides and stop elements on both transverse sides, wherein the clamping elements are adjusted by displacing and rotating a control rod,
 i) an arrangement for applying acryl in dots and an arrangement for applying silicone in lines onto support surfaces of the module frame,
 j) an arrangement for laying the sensor carrier pane or the lens pane, wherein these panes are transported in a tension-free manner by means of special suction devices and are set down with a centrally-positioned contact pressure,
 k) an arrangement for measuring the respective pane position and for positioning the sensor carrier pane or the lens pane,
 l) an arrangement for finely adjusting the lens pane relative to CPV sensors of the sensor carrier pane, wherein a voltage is applied to selected CPV sensors, whereupon light emitted therefrom via the Fresnel lenses is detected and the lens pane is adjusted in such a way that the emission from Fresnel lenses is at a maximum,
 m) an arrangement for curing the applied silicone between the module frame and the respective pane by means of a plurality of UV light emitters,
 n) arrangements for transporting the workpieces to be processed.

2. The device as claimed in claim 1, wherein the suction device for transporting the panes is designed such that each sucker head consists of solid material and an area delimited by a ring seal is flat and arbitrarily shaped.

3. The device as claimed in claim 1, wherein basic adjustment of the clamping elements is performed by displacing a control rod, via an eccentric fastened on the control rod and a spline contacted thereby.

4. The device according to claim 1, wherein as the carriage holds a module frame in a tension-free manner, compressive forces occurring are detected by means of sensors and the compressive forces are automatically adjusted by means of the control rod and four servomotors on each longitudinal side.

5. The device according to claim 1, further comprising non-transitory instructions for causing the device to operate as described.

* * * * *